United States Patent [19]

Clayton

[11] 4,035,730
[45] July 12, 1977

[54] FM NOISE THRESHOLD EXTENSION DEMODULATOR APPARATUS

[75] Inventor: Lorimer Clayton, Stone Mountain, Ga.

[73] Assignee: Scientific-Atlanta, Inc., Atlanta, Ga.

[21] Appl. No.: 672,190

[22] Filed: Mar. 31, 1976

[51] Int. Cl.² .................................. H03D 3/00
[52] U.S. Cl. .......................... 325/348; 325/473; 325/347; 325/377; 329/134
[58] Field of Search ........... 325/344, 347, 346, 348, 325/475, 476, 477, 479, 473, 480, 474, 377, 376; 329/134, 136, 132, 133, 135

[56] References Cited

U.S. PATENT DOCUMENTS

| 3,092,780 | 6/1963 | Fisher | 329/136 |
|---|---|---|---|
| 3,195,059 | 7/1965 | Adams | 325/346 |
| 3,243,604 | 3/1966 | Johnson | 325/473 |
| 3,281,698 | 10/1966 | Rose, Jr. et al. | 325/477 |
| 3,611,169 | 10/1971 | Hess | 325/475 |

Primary Examiner—Benedict V. Safourek
Assistant Examiner—Tommy P. Chin
Attorney, Agent, or Firm—Martin LuKacher

[57] ABSTRACT

Apparatus for lowering the noise threshold at which FM and other angle modulated signals may be demodulated is described wherein an oscillating limiter provided by an amplitude limiter having a bandpass filter in regenerative feedback relationship therewith is connected ahead of the demodulator. The bandpass filter is made tunable in response to a steering signal developed by processing the frequency proportional signal at the output of the demodulator to attenuate high frequency components thereof which are outside the baseband of the signals and adjusting the amplitude of the signal so that the center frequency of the bandpass filter is caused to substantially match the frequency of the frequency modulated signal. The steering signal circuit has electrical inertia, thus during click events the oscillating limiter will oscillate at a frequency which matches the best available estimate of the instantaneous frequency of the modulated signal, thereby minimizing both impulse noise (clicks) and discontinuities in the output, frequency demodulated (base band) signal during a click event.

9 Claims, 6 Drawing Figures

FM NOISE THRESHOLD EXTENSION DEMODULATOR APPARATUS

The present invention relates to noise threshold extension FM demodulator apparatus and particularly to FM demodulators having oscillating limiter noise threshold extension circuitry.

The terms FM and frequency modulation as used herein also connote, and should be taken to mean, phase or angle modulation as well as frequency modulation, and the term FM demodulator should also be taken to mean a frequency discriminator as well as other types of phase and angle demodulator circuits.

The invention is especially suitable for use in receivers of FM signals having relatively low modulation indices, say of about 4. The invention is particularly adaptable for use in receivers used in those satellite communications systems where FM communications are specified.

Noise threshold extension has been a long sought after goal for the improvement of FM reception, especially in noisy environments. Various techniques have been proposed for noise threshold extension demodulators. Among these techniques are the use of phase locked loops and frequency modulation feedback arrangements. These techniques are described in an article by Donald T. Hess, which appeared in the October 1968 issue of the IEEE Transactions on Communications Technology, pps. 746 through to 748. The frequency modulation feedback technique is further described in U.S. Pat. No. 3,238,460, issued Mar. 1, 1966. A phase locked loop technique is described in U.S. Pat. No. 3,742,361, issued June 26, 1973. A different approach which is called the frequency-locked loop in the Hess article, is described in U.S. Pat. No. 3,611,169, issued Oct. 5, 1971. Another technique which involves squelching or cancelling noise impulses, usually referred to as clicks which occur when the signal to noise ratio of the FM signal is below the noise threshold, is described in U.S. Pat. No. 3,588,705, issued June 28, 1971. Reference may be had to these patents and publications for further information respecting the noise threshold effect in FM demodulation.

A technique for improving FM threshold extension performance of FM demodulators involves the use of regenerative circuits (see U.S. Pat. No. 2,388,200) and oscillating limiters which are connected ahead of the FM demodulator. Such oscillating limiters are described in a patent to J. T. Boatwright, 3,217,257, and in an article by E. J. Baghdady appearing in the IRE Transactions on Communications Systems, September 1961, page 194.

The oscillating limiter circuit consists of an amplitude limiter and a tuned circuit in feedback relationship therewith. The tuned circuit is tuned to the center frequency of the IF input signal to limiter. In the presence of a strong input signal the oscillating limiter functions as a conventional amplitude limiter. For input signals near the threshold SNR, the oscillating limiter functions as a bandpass filter with a bandwidth related to the amplitude of the input signal. As described in the Boatwright patent, when the tuning of the tuned circuit is made to track the frequency deviation of the modulated signal, the threshold extension performance of the oscillating limiter is improved. It has been found in accordance with this invention that further improvement in FM extension performance, especially when low modulation index FM signals are received, is obtained when the tuning of the tuned circuit in the limiter is controlled so as not to follow the modulation of the FM signal instantaneously, as is the case in the circuit design described in the Boatwright patent, but instead to respond to the modulation in a predetermined manner. Consider that if the modulation is tracked instantaneously, not only the signal but also any accompanying noise, particularly the noise which occurs at the onset of click events will be tracked and some noise due to these events enters the system. In the low modulation index case, the extent to which the oscillating limiter, even with tracking, can improve threshold extension performance is limited because the ratio of the limiter bandwidth to the bandwidth of the signal is relatively small, particularly as compared to high modulation index signals as used in FM broadcast applications. Thus for low modulation index FM signals, it is especially desirable that the noise not be tracked and thus not be permitted to enter the system such that the threshold extension performance of the oscillating limiter will be maximally utilized.

Briefly described, a threshold extension FM demodulator, according to the invention, has an oscillating limiter including a limiter circuit and a tunable bandpass filter in feedback relationship therewith. A steering signal is generated in response to the demodulated signal from an FM demodulator and applied to tune the filter so that the center frequency of the bandpass filter tracks the best available estimate of the frequency of the modulated signal. This steering signal is generated by smoothing means which removes the high frequency or noise components of the demodulated signal outside of its base band. Such a smoothing means may for example be a low pass filter or a non-linear rate of change limiter. Such a limiter transmits, as the steering signal, the demodulated base band signal without modification except when the derivative of that signal with respect to time exceeds a specified value, which is greater than the maximum rate of change of that base band signal when transmitted without distortion, and thus corresponds to a noise or click event condition. Then the demodulated signal is modified and transmitted as the steering signal. The steering signal is also amplitude adjusted to establish the proper constant of proportionality so that the center frequency of the bandpass filter substantially matches the FM signal frequency. The natural frequency of the oscillating limiter tracks the frequency of the modulated FM signal during voice, FSK, PSK, or other forms of modulation, in a manner controlled by the smoothing means, such that the signal but not the noise is tracked.

During a click event the envelope of the FM signal (plus noise) momentarily becomes small (see, particularly FIG. 4 of U.S. Pat. No. 3,611,169 referenced above). The steering signal (by virtue of the smoothing and amplitude adjustment process used in the course of its generation, which introduces electrical inertia therein) assures that the natural frequency of the oscillator limiter represents the frequency of the FM signal at the time of occurrence of the click event. By virtue of the smoothing process the tuning of the oscillating limiter is made less agile to noise pulses, such that noise is not tracked and permitted to enter the system. In the absence of an input signal, as occurs during the click event, the oscillating limiter oscillates or rings at its natural frequency (viz., the frequency of the feedback loop including the limiter and the bandpass filter).

Since this frequency has been constrained by the steering signal, both the click and the discontinuity in the demodulated signal during the click event are minimized. The noise threshold in terms of the minimum signal to noise ratio which the demodulator can handle is thereby improved significantly.

Accordingly, it is an object of the present invention to provide an improved FM demodulator with improved FM threshold extension performance.

It is another object of the present invention to provide an improved FM demodulator having an oscillating limiter noise threshold extension circuit.

It is a further object of the present invention to provide improved apparatus capable of demodulating low modulation index FM signals having a higher noise content (lower signal to noise ratio) than heretofore practicable.

It is a still further object of the present invention to provide an improved threshold extension FM demodulator which minimizes both clicks and distortion of the output signal which might otherwise result in the process of the suppression of such clicks.

It is a still further object of the present invention to provide an improved threshold extension FM demodulator which may be implemented more simply and at lower costs than has been heretofore practicable.

The foregoing and other objects and advantages of the present invention will become more readily apparent from a reading of the following description in connection with the accompanying drawings in which.

Figure 1:
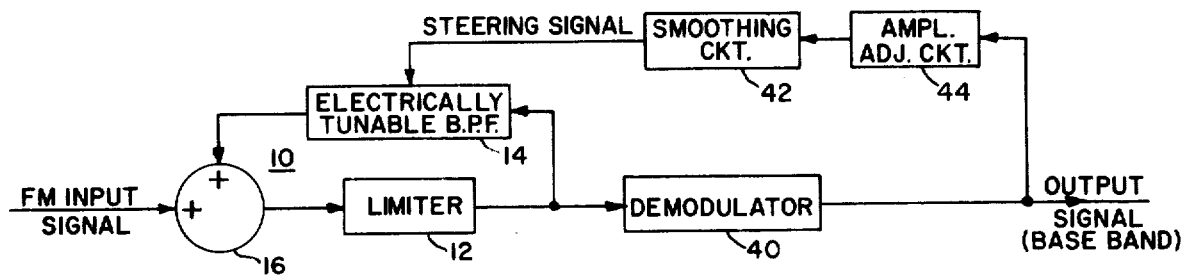
FIG. 1 is a block diagram of a threshold extension FM demodulator which embodies the invention.
Figure 2:
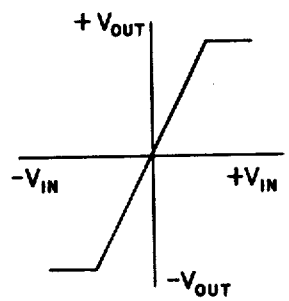
FIG. 2 is a curve illustrating the input/output characteristics of the limiter used in the apparatus shown in FIG. 1.

Referring more particularly to FIG. 1. The FM signal, as from the intermediate frequency (IF) amplifier stages of an FM receiver is applied to an oscillating limiter 10. This oscillating limiter consists of an amplitude limiter 12 and an electrically tunable bandpass filter 14 which is connected across the limiter 12 in regenerative feedback relationship by way of summing circuit or junction 16. The amplitude limiter may be an active or passive limiter circuit having the input/output characteristic shown in FIG. 2. For example, it may be an integrated circuit IF limiter or it may be a diode limiter circuit as in the above referenced Boatwright patent.

Figure 3:
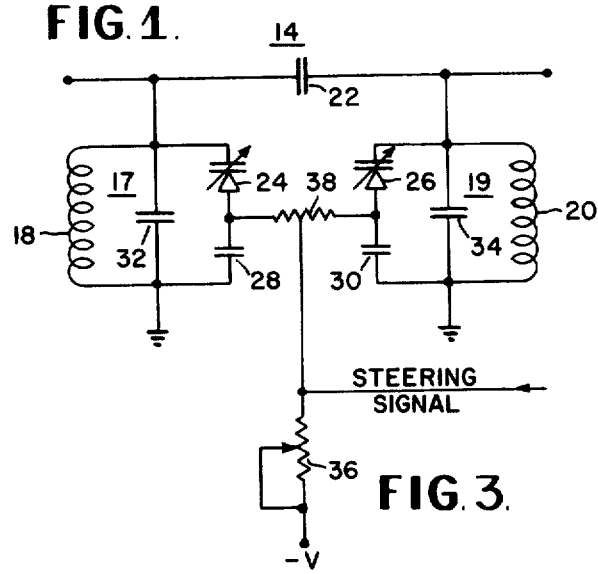
FIG. 3 is a schematic diagram of the electrically tunable bandpass filter used in the apparatus shown in FIG. 1.

The bandpass filter 14 may more particularly be a filter whose low pass prototype has a first or second order transfer function (impulse response) having provision for electrical tuning. A suitable filter 14 is illustrated in FIG. 3. It consists of two parallel resonant circuits 17 and 19, coupled by a series capacitor 22. The resonant circuit 17 contains an inductor 18, a variable capacitor diode 24, a trimming capacitor 32, and the resonant circuit 19 contains an inductor 20, a variable capacitor diode 26 and a capacitor 34.

The passband of the oscillating limiter 10 may be small as compared to the passband of the IF amplifier. It is desirably wide enough to pass the first order sideband of the FM signal (translated to the IF).

Tuning is accomplished by the use in the resonant circuits of the voltage variable capacitor diodes 24 and 26 (called Varactors or VVCs). The VVCs are connected in series with dc blocking capacitors 28 and 30 across the inductors 18 and 20. The trimming capacitors 32 and 34 are also connected across the inductors. A bias voltage from a source indicated at −V is applied through a potentiometer 36 to a tapped resistor 38 which is connected to the VVCs 24 and 26. A control or tuning signal called the steering signal is added to the bias to provide a control voltage for tuning the VVCs 24 and 26 and thereby varying the center frequency of the filter 14.

The filter 14 establishes a regenerative feedback circuit from the output of the limiter 12 to its input where the feedback is added to the input FM signal plus noise waveform in the summing circuit 16. In the case where an integrated circuit limiter is used, the summing circuit may be a resistor network connected to the input terminal of that limiter. When the envelope of the combined (signal, noise and feedback) waveform has an amplitude lower than the knee of the limiter 12 characteristic (FIG. 2) the limiter output waveform is a replica of the combined input waveform. When the envelope amplitude is greater than the knee, the output is substantially a square wave of constant amplitude.

In the absence of an input signal the oscillating limiter 10 oscillates marginally at a frequency determined by the bandpass filter 14 (at the center frequency of the filter). In the presence of a strong signal, the circuit functions as a conventional amplitude limiter and the instantaneous phase of the output signal of the limiter follows the input signal. For input signals near the threshold SNR, the circuit functions as a bandpass filter whose band width is an adaptive function of the amplitude of the input FM signal.

The oscillating limiter 10 is connected ahead of an FM demodulator 40 which may be an FM discriminator of the conventional type. The demodulator provides an output signal at the base band (viz., the output signal is a replica of the signal, say voice, FSK, codes or the like which modulates the carrier at the FM transmitter). This signal varies in amplitude and is proportional to the instantaneous frequency of the frequency modulated signal. The demodulator output signal is used to provide a steering signal which varies the center frequency of the tunable filter 14 so that it substantially matches the frequency of the FM input signal to the oscillating limiter 10.

During the click event the output frequency tends to deviate from the instantaneous frequency of the FM signal towards the natural frequency of the regenerative feedback loop as determined by the center frequency of the filter 14. Thus, by tuning the filter 14 so that its frequency tracks the frequency of the FM signal (i.e., the modulation thereof) the click disturbance is reduced. It is a feature of this invention to provide means for processing this output signal and generating a steering signal so as to still further enhance threshold extension performance, especially for FM signals of low modulation index. To this end a smoothing circuit 42 is provided which processes the output signal from the demodulator on a narrow band basis.

The output signal from the demodulator 40 may contain perturbations due to noise which are usually in the form of high frequency components of the output signal. These perturbations are removed by the smoothing circuit 42. This circuit has electrical inertia which is sufficient not to follow the noise, including the incipient click excursions, but is not so great that the modulation of the signal is not followed.

The smoothing circuit may be a second order low pass filter having the transfer function (impulse response):

$$H(s) = \frac{1}{1 + s\frac{2\zeta}{W_n} + s^2 \frac{1}{W_n^2}}$$

Preferably, a low pass filter having a natural frequency $W_n$ which is two-and-one-half times the highest modulation frequency (viz., the highest frequency of the baseband signal) and a damping factor $\zeta$ equal to one-half may be used.

Figure 5:
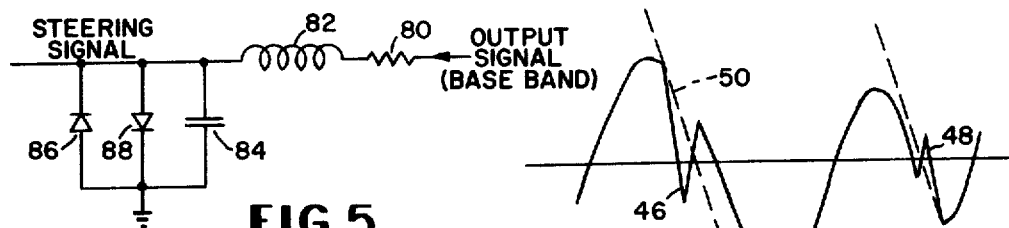

FIG. 5 shows a suitable filter circuit made up of a series resistor 80 and inductor 82 and a shunt capacitor 84. Diodes 86 and 88 limit the voltage excursion of the output steering signal and assure acquisition upon application of the signal.

In series with the smoothing circuit in the steering signal path is an amplitude adjusting circuit 44 which establishes the proper constant of proportionality between the output baseband signal amplitude and the center frequency of the bandpass filter 14. The amplitude adjusting circuit 44 may be a potentiometer or an adjustable gain amplifier.

In adjusting the apparatus shown in FIG. 1 the gain of the steering circuit is set to zero, (this may be accomplished by increasing the attenuation interposed in the signal path by the amplitude adjusting circuit 44). A FM input signal is applied which has a signal to noise ratio in the threshold region so that clicks are observed in the demodulated or baseband output signal. The gain or the steering signal amplitude is increased using the circuit 44. Clicks should now occur less frequently. The gain of circuit 44 or amplitude of the steering signal is then set at an optimum setting where the bandpass filter 14 best matches the modulation of the input signal. The gain in the regenerative feedback circuit of limiter 12, filter 14 and summing circuit 16 may be increased to decrease the closed loop bandwidth. This increase in gain provides a further extension of noise threshold and in the SNR of the demodulated output signal. Control of the loop bandwidth may also be obtained by holding the gain in the feedback circuit of the limiter 12 fixed and adjusting the level of the applied input signal in relation to the feedback signal to the limiter 12.

Figure 4:
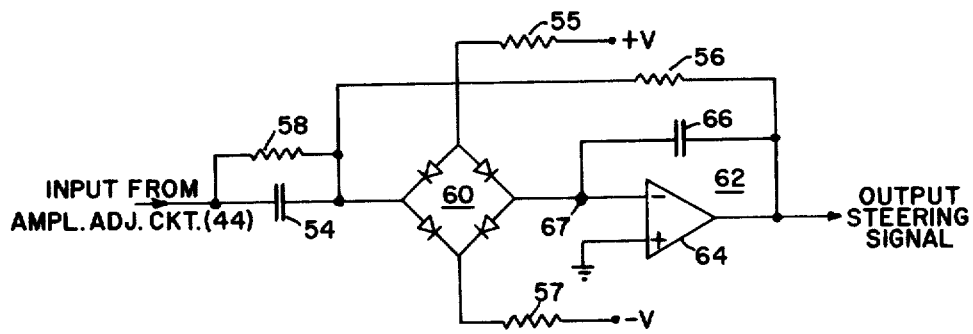
FIGS. 4 and 5 are schematic diagrams of smoothing circuits which may be used in the apparatus illustrated in FIG. 1.

The non-linear rate of change limiter circuit shown in FIG. 4 may be used in lieu of the low pass filter described above for providing the smoothing circuit 42. This non-linear rate of change limiter transmits, without modification, the steering signal so long as its rate of change (viz., first derivative of amplitude with respect to time) has an absolute magnitude less than a selected value. The modulating waveform will then be transmitted by the limiter with adequate fidelity. This value may, for example in the case of voice signals, be related to the highest frequency component of the voice signal. Thus, if 3 KHz is the highest component of the voice signal, any signal components above 3 KHz which exceed a certain amplitude will be taken as noise. It is postulated for purposes of this example that the high frequency components of voice will be of small amplitude. During those time intervals in which the demodulator output signal changes at a rate of change exceeding the chosen value (e.g., has components above 3 KHz of large amplitude) the signal will be modified in the rate of change limiter of FIG. 4; particularly the output signal from the demodulator 40 will be "slew-rate" limited and will change only at a constant rate. Accordingly, during click events when the demodulator output signal changes in amplitude at or above the selected rate, the steering signal at the output of the rate of change limiter will be slew rate limited.

Figure 6:
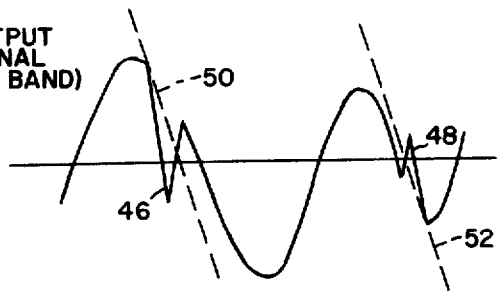
FIG. 6 is a waveform of an input signal which may be applied to the circuit shown in FIG. 4.

The operation of the non-linear rate of change limiter circuit will be apparent from FIG. 6, which illustrates the demodulator output signal. Two exemplary click events 46 and 48 are illustrated on the positive going and negative going portions of the signal. During these click events the rate of change of the signal exceeds the selected value. Notwithstanding such rates of change the non-linear rate of change limiter controls and smooths the signal so that its rate of change is limited to the maximum rate of change represented by the dash lines 50 and 52.

The non-linear rate of change limiter may be implemented by a differentiating circuit consisting of a capacitor 54, a diode bridge 60, and an integrating circuit 62. The bridge is fed by current sources provided by the supply voltage source indicated at +V and −V which feed the opposite corners of the bridge through large resistors 55 and 57. The integrating circuit is made up of an operational amplifier 64 and its feedback capacitor 66. The resistor 56 and another resistor 58 provide biasing for the amplifier 64 and prevents saturation thereof. The summing junction 67 is kept at ground due to the feedback via the capacitor 66. The current through capacitor 54 is proportional to the derivative of the input signal, since the signal voltage is applied across the capacitor between the input and virtual ground at the junction 67.

So long as the current through the differentiating capacitor delivered to the junction 67 does not exceed the current to the corners of the diode bridge limiter 60 the bridge acts like a short circuit. The signal is differentiated in the capacitor 54 and integrated in the integrating circuit 62 and appears as a replica of its original form as the output steering signal.

If the current through capacitor 54 exceeds the current supplied to the corners of the bridge 60, the bridge blocks transmission of current from the capacitor 54 to the summing junction 67 and the current to the junction 67 is limited to the current supplied through one of the resistors 55 or 57 to a corner of the bridge. The current is therefore limited when the selected rate of change of the input signal voltage is exceeded. The output steering signal will therefore be slew rate limited. In the event that the first derivative of this input signal does not exceed the selected value, the input signal is transmitted directly to the electrically tunable bandpass filter 14 as the steering signal without modification.

From the foregoing description it will be apparent that there has been provided improved apparatus for demodulating FM signals, which apparatus provides improved FM threshold extension performance. Variations and modifications in the herein described apparatus will undoubtedly suggest themselves to those skilled in the art. Accordingly, the foregoing description should be taken merely as illustrative and not in any limiting sense.

What is claimed is:

1. For use in apparatus for demodulating FM signals having a frequency demodulator circuit for providing output signals corresponding to the frequency of said FM signals, noise threshold extension circuitry which comprises
   a. an amplitude limiter, said limiter being connected to the input of said demodulator circuit,
   b. a tunable bandpass filter connected in regenerative feedback relationship across said limiter, and
   c. means responsive to said demodulator circuit output signals for generating and applying to said bandpass filter a steering signal for varying the tuning of said bandpass filter to track the frequency modulation of said FM signals without following the noise therein.

2. The invention as set forth in claim 1 wherein said last named means comprises smoothing means for attenuating high frequency components of said demodulator output signals whereby only the baseband components of said output signal from which noise has been removed are provided.

3. The invention as set forth in claim 2 wherein said last named means also comprises means coupled to said smoothing means for adjusting the amplitude of said demodulator output to cause said steering signal amplitude to be proportional to the center frequency of said bandpass filter whereby said center frequency is substantially matched to the center frequency of said FM signal.

4. The invention as set forth in claim 2 wherein said smoothing means is a linear low pass filter.

5. The invention as set forth in claim 4 wherein said low pass filter has an impulse response of second order wherein the natural frequency is about two-and-one-half times the frequency at the upper end of said baseband and the damping factor is about one half.

6. The invention as set forth in claim 2 wherein said smoothing means includes circuit means for limiting the rate of change of said demodulator output signals to a predetermined maximum rate of change only when they change in rate at greater than a given rate commensurate with the maximum rate of change thereof when undistorted.

7. The invention as set forth in claim 6 wherein said circuit means includes a limiter circuit, a differentiating means, integrating circuit, and other circuit means connecting said differentiating means, limiter and integrating means for transmitting said demodulator output signal without modification except when the demodulator output signal rate of change exceeds said predetermined maximum.

8. The invention as set forth in claim 7 wherein said limiter is a diode bridge limiter, said differentiating circuit includes a first capacitor connected to one corner of said bridge, said integrating circuit includes an operational amplifier input connected to a corner of said bridge opposite to said one corner and having a second capacitor connected in feedback relation across said amplifier, and means for providing current sources connected to the remaining corners of said bridge.

9. The invention as set forth in claim 2 wherein said smoothing means is provided by non-linear rate of change limiter means for transmitting said demodulator output signal as said steering signal without modification when its first derivative with respect to time is less than a selected value and for limiting the rate of change of said demodulator output signal to provide as said steering signal a signal of limited amplitude during those intervals when said demodulator output signal first derivative exceeds said selected value.

* * * * *